(12) United States Patent
Tabuchi et al.

(10) Patent No.: US 10,469,778 B2
(45) Date of Patent: Nov. 5, 2019

(54) METHODS AND APPARATUS FOR ACTUATOR CONTROL

(71) Applicant: SEMICONDUCTOR COMPONENTS INDUSTRIES, LLC, Phoenix, AZ (US)

(72) Inventors: Yoshihisa Tabuchi, Gifu (JP); Atsushi Noda, Ogaki (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 7 days.

(21) Appl. No.: 16/002,384

(22) Filed: Jun. 7, 2018

(65) Prior Publication Data

US 2019/0131901 A1    May 2, 2019

Related U.S. Application Data

(63) Continuation of application No. 16/002,214, filed on Jun. 7, 2018.
(Continued)

(51) Int. Cl.
| | |
|---|---|
| *H04N 5/357* | (2011.01) |
| *H03F 3/45* | (2006.01) |
| *H04N 5/232* | (2006.01) |
| *H02P 7/025* | (2016.01) |
| *G02B 7/10* | (2006.01) |
| *G03B 5/00* | (2006.01) |

(Continued)

(52) U.S. Cl.
CPC ............ *H04N 5/3572* (2013.01); *G02B 7/10* (2013.01); *G03B 5/00* (2013.01); *G03B 13/36* (2013.01); *H02P 7/025* (2016.02); *H02P 7/292* (2013.01); *H03F 3/45475* (2013.01); *H04N 5/23212* (2013.01); *H04N 5/3577* (2013.01); *G03B 2205/0015* (2013.01); *G03B 2205/0069* (2013.01); *H03F 2200/129* (2013.01); *H03F 2203/45116* (2013.01); *H03F 2203/45151* (2013.01); *H03F 2203/45528* (2013.01)

(58) Field of Classification Search
CPC .. G02B 7/10; G03B 13/36; G03B 2205/0015; G03B 2205/0069; G03B 5/00; H02P 7/025; H02P 7/292; H03F 2200/129; H03F 2203/45116; H03F 2203/45151; H03F 2203/45528; H03F 3/45475; H04N 5/23212; H04N 5/3572; H04N 5/3577
See application file for complete search history.

(56) References Cited

U.S. PATENT DOCUMENTS

| | | | |
|---|---|---|---|
| 6,791,306 B2 * | 9/2004 | Walters | H02M 3/156 323/282 |
| 6,961,253 B1 * | 11/2005 | Cohen | H02M 1/08 363/89 |

(Continued)

*Primary Examiner* — Chiawei Chen
(74) *Attorney, Agent, or Firm* — The Noblitt Group, PLLC; Hettie L. Haines

(57) ABSTRACT

Various embodiments of the present technology may comprise methods and apparatus for actuator control. The methods and apparatus may comprise various circuits and/or systems to detect an induced voltage and various signal processing functions to utilize the induced voltage to control the actuator. The apparatus for actuator control may comprise an induced voltage detection circuit and adjust the actuator position according to the detected induced voltage.

20 Claims, 18 Drawing Sheets

Related U.S. Application Data

(60) Provisional application No. 62/577,950, filed on Oct. 27, 2017.

(51) Int. Cl.
*G03B 13/36* (2006.01)
*H02P 7/292* (2016.01)

(56) References Cited

U.S. PATENT DOCUMENTS

| | | | | |
|---|---|---|---|---|
| 7,034,499 | B2 * | 4/2006 | Kerlin, IV | H02P 6/00 |
| | | | | 318/749 |
| 8,487,593 | B2 * | 7/2013 | Laur | H02M 3/1563 |
| | | | | 323/217 |
| 2009/0190910 | A1 | 7/2009 | Yasuda | |
| 2011/0279067 | A1 | 11/2011 | Murata | |
| 2013/0038781 | A1 | 2/2013 | Inaji | |
| 2013/0143490 | A1 * | 6/2013 | Kim | H04B 5/0031 |
| | | | | 455/41.1 |
| 2013/0300209 | A1 * | 11/2013 | Long | H01F 38/14 |
| | | | | 307/104 |
| 2014/0002174 | A1 | 1/2014 | Guan | |
| 2014/0268909 | A1 * | 9/2014 | Digiacomo | H02M 3/33553 |
| | | | | 363/21.04 |
| 2014/0368676 | A1 | 12/2014 | Yoshimuta | |
| 2015/0022128 | A1 * | 1/2015 | Boscolo | H02P 6/34 |
| | | | | 318/400.04 |
| 2015/0022709 | A1 | 1/2015 | Yamanaka | |
| 2015/0123591 | A1 | 5/2015 | Inoue | |
| 2016/0327806 | A1 | 11/2016 | Kasamatsu | |
| 2018/0340964 | A1 * | 11/2018 | Ranucci | G01R 27/2611 |

\* cited by examiner

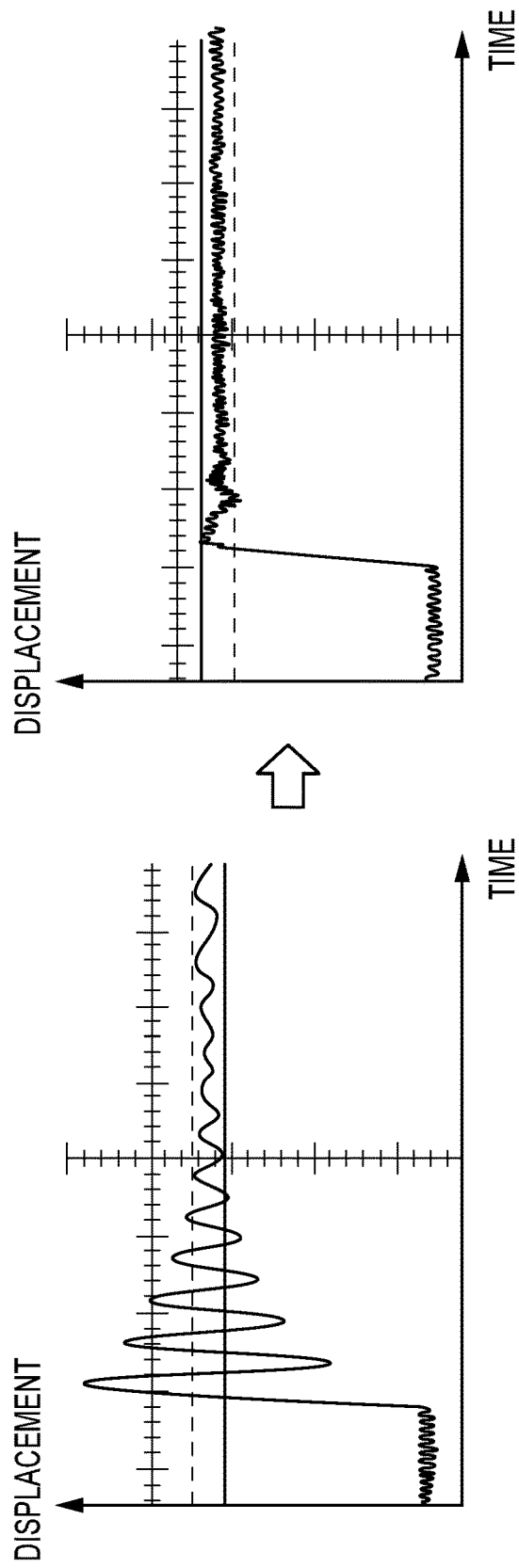

METHODS AND APPARATUS FOR ACTUATOR CONTROL

CROSS-REFERENCE TO RELATED APPLICATION

This application is a continuation of U.S. patent application Ser. No. 16/002,214, filed on Jun. 7, 2018, which claims the benefit of U.S. Provisional Patent Application Ser. No. 62/577,950, filed on Oct. 27, 2017.

BACKGROUND OF THE TECHNOLOGY

Electronic devices, such as cellular telephones, cameras, and computers, commonly use a lens module in conjunction with an image sensor to capture images. Many imaging systems employ autofocus methods and various signal processing techniques to improve image quality by adjusting the position of the lens relative to the image sensor.

Autofocus systems generally employ an actuator to move the lens to an optimal position to increase the image quality. Many electronic devices utilize low-noise linear motion, such as linear actuators, to facilitate autofocus. Due to the mechanical properties of the linear actuator, the operation of the actuator is governed by the Lorentz Force principle. When a constant current is applied to the actuator, a constant force is created as well as an induced voltage that is proportional to the velocity of the actuator. In some cases, external forces or control operations may generate resonance vibrations in the actuator, which affect the settling time of actuator. The normal mode of operation of the actuator, however, is not designed to directly stop or suppress the resonance vibrations. Therefore, the settling time of the actuator may be greater than desired.

SUMMARY OF THE INVENTION

Various embodiments of the present technology may comprise methods and apparatus for actuator control. The methods and apparatus may comprise various circuits and/or systems to detect an induced voltage and various signal processing functions to utilize the induced voltage to control the actuator. The apparatus for actuator control may comprise an induced voltage detection circuit and adjust the actuator position according to the detected induced voltage.

BRIEF DESCRIPTION OF THE DRAWINGS

A more complete understanding of the present technology may be derived by referring to the detailed description when considered in connection with the following illustrative figures. In the following figures, like reference numbers refer to similar elements and steps throughout the figures.

FIG. 15A is a waveform representing the displacement of the lens (relative to a target position) in an autofocus system without feedback control, where the displacement is a result of a change in target position;

FIG. 15B is a waveform representing the displacement of the lens (relative to a target position) in accordance with an exemplary embodiment of the present technology, where the displacement is a result of a change in target position;

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various actuators, sensors, lenses, drivers, signal converters, semiconductor devices, such as transistors and capacitors, and the like, which may carry out a variety of functions. In addition, the present technology may be practiced in conjunction with any number of systems, such as automotive, aerospace, medical, scientific, surveillance, and consumer electronics, and the systems described are merely exemplary applications for the technology. Further, the present technology may employ any number of conventional techniques for capturing image data, sampling image data, processing image data, and the like.

Figure 1:
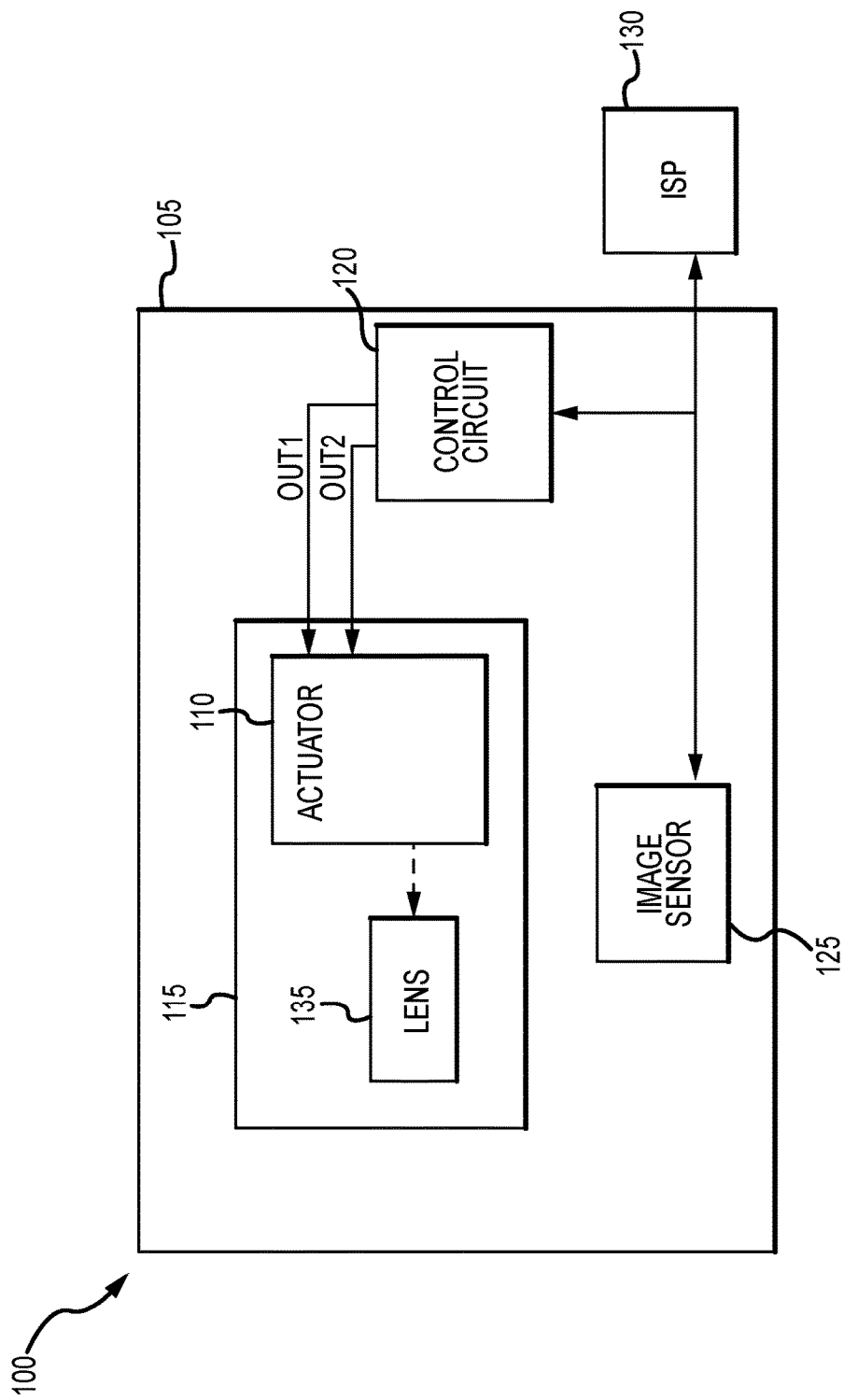
FIG. 1 is a block diagram of an imaging system in accordance with an exemplary embodiment of the present technology.

Methods and apparatus for actuator control according to various aspects of the present technology may operate in conjunction with any suitable electronic system, such as imaging systems, "smart devices," wearables, consumer electronics, and the like. Referring to FIG. 1, an exemplary imaging system 100 may be incorporated into an electronic device, such as a digital camera or portable computing device. For example, in various embodiments, the imaging system 100 may comprise a camera module 105 and an image signal processor (ISP) 130.

The camera module 105 may capture image data and perform various operating functions, such as autofocus and/or optical image stabilization. For example, the camera module 105 may comprise an image sensor 125, a lens module 115 positioned adjacent to the image sensor 125, and a control circuit 120. The control circuit 120 and the lens module 115 may be configured to communicate with each other and operate together to automatically focus an object or a scene on the image sensor 125.

The image sensor 125 may be suitably configured to capture image data. For example, the image sensor 125 may comprise a pixel array (not shown) to detect light and convey information that constitutes an image by converting the variable attenuation of light waves (as they pass through or reflect off the object) into electrical signals. The pixel array may comprise a plurality of pixels (not shown) arranged in rows and columns, and the pixel array may contain any number of rows and columns, for example, hundreds or thousands of rows and columns. Each pixel may comprise any suitable photosensor, such as a photogate, a photodiode, and the like, to detect light and convert the detected light into a charge. The image sensor 125 may be implemented in conjunction with any appropriate technology, such as active pixel sensors in complementary metal-oxide-semiconductors (CMOS) and charge-coupled devices.

The lens module 115 may be configured to focus light on a sensing surface of the image sensor 125. For example, the lens module 115 may comprise a lens 135, with a fixed diameter, positioned adjacent to the sensing surface of the image sensor 125. The lens module 115 may further comprise an actuator 110, for example a linear resonant actuator, such as a voice coil motor (VCM), configured to move the lens 135 along an x-, y-, and z-axis. The actuator 110 may be represented as an inductor in series with a resistor.

In various embodiments, the imaging system 100 is configured to move portions of the lens module 115 that secure the lens 135 to perform autofocus functions. For example, the lens module 115 may comprise a telescoping portion (not shown) that moves relative to a stationary portion (not shown). In various embodiments, the telescoping portion may secure the lens 135. As such, the actuator 110 may move the telescoping portion to shift the lens 135 away from or closer to the image sensor 125 to focus the object or scene on the image sensor 125. In various embodiments, the image sensor 125 may be fixed to the stationary portion or may be arranged at a fixed distance from the stationary portion.

In various embodiments, the ISP 130 may perform various digital signal processing functions, such as color interpolation, color correction, facilitate auto-focus, exposure adjustment, noise reduction, white balance adjustment, compression, and the like, to produce an output image. The ISP 130 may comprise any number of semiconductor devices, such as transistors, capacitors, and the like, for performing calculations, transmitting and receiving image pixel data, and a storage unit for storing pixel data, such as random-access memory, non-volatile memory or any other memory device suitable for the particular application. In various embodiments, the ISP 130 may be implemented with a programmable logic device, such as a field programmable gate array (FPGA) or any other device with reconfigurable digital circuits. In other embodiments, the image signal processor 130 may be implemented in hardware using non-programmable devices. The ISP 130 may be formed partially or entirely within an integrated circuit in silicon using any suitable complementary metal-oxide semiconductor (CMOS) techniques or fabrication processes, in an ASIC (application-specific integrated circuit), using a processor and memory system, or using another suitable implementation.

The ISP 130 may transmit the output image to an output device, such as a display screen or a memory component, for storing and/or viewing the image data. The output device may receive digital image data, such as video data, image data, frame data, and/or gain information from the image signal processor 130. In various embodiments, the output device may comprise an external device, such as a computer display, memory card, or some other external device.

The control circuit 120 controls and supplies power to various devices within the imaging system 100. For example, the control circuit 120 may control and supply power to the lens module 115 to move the actuator 110 to a target position. The control circuit 120 may operate in conjunction with the ISP 130, the image sensor 125, and/or other devices to determine the appropriate amount of power and/or current to supply to the actuator 110. The control circuit 120 may supply a current (i.e., a drive current), having a magnitude and direction, to the actuator 110, which in turn moves the lens 135. The control circuit 120 may comprise any suitable device and/or system capable of providing energy to the actuator 110.

In general, the actuator 110 responds to the drive current by moving the lens 135 an amount that is proportion to the drive current supplied by the control circuit 120. According to an exemplary embodiment, the actuator 110 may comprise a voice coil motor. In operation, the actuator 110 may generate a self-induced voltage (i.e., back EMF, induced voltage) that opposes the change that causes it and the greater the speed of the actuator 110, the greater the induced voltage.

Figure 2:
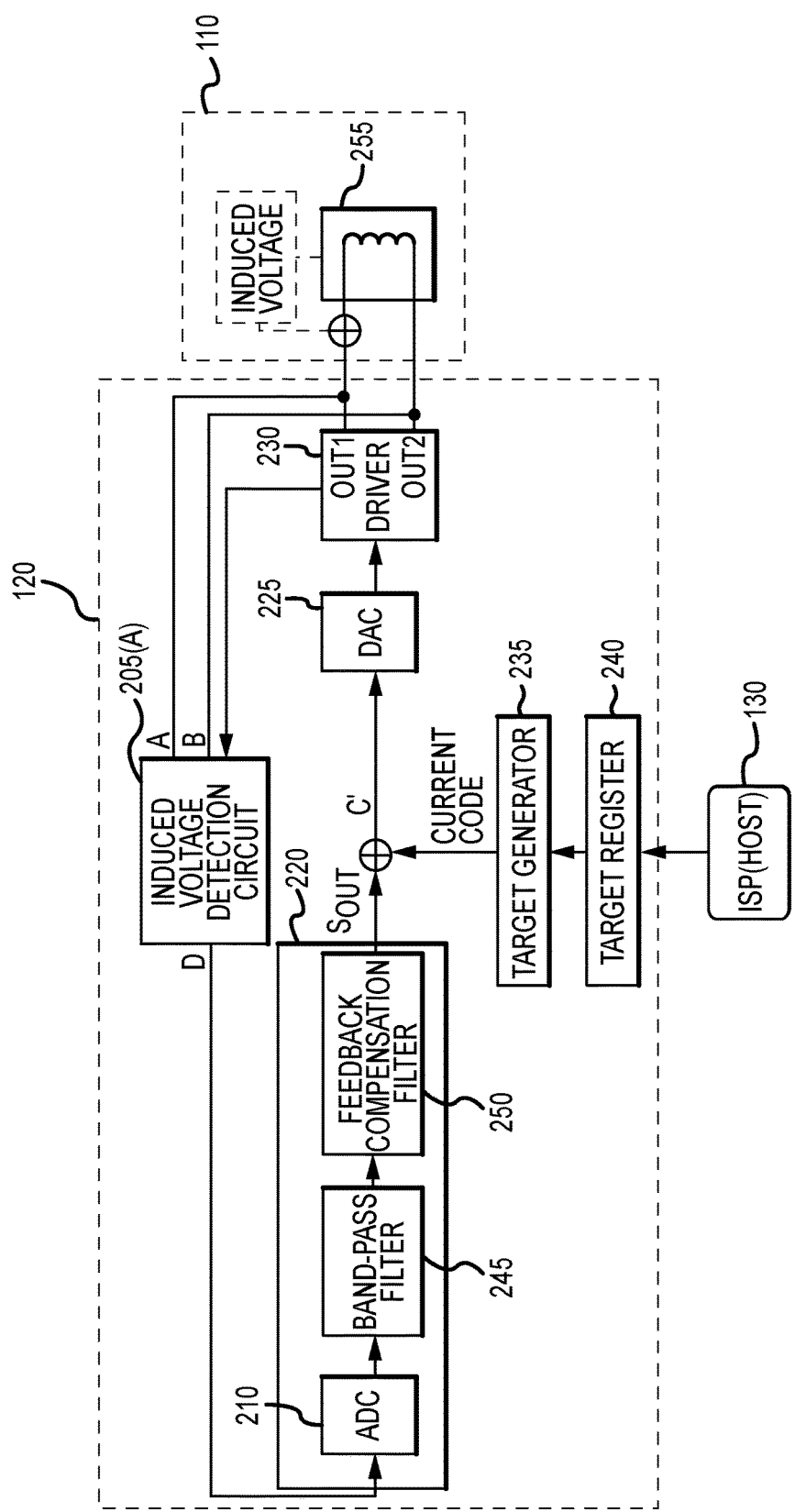
FIG. 2 is a block diagram of an autofocus system in accordance with a first embodiment of the present technology.
Figure 3:
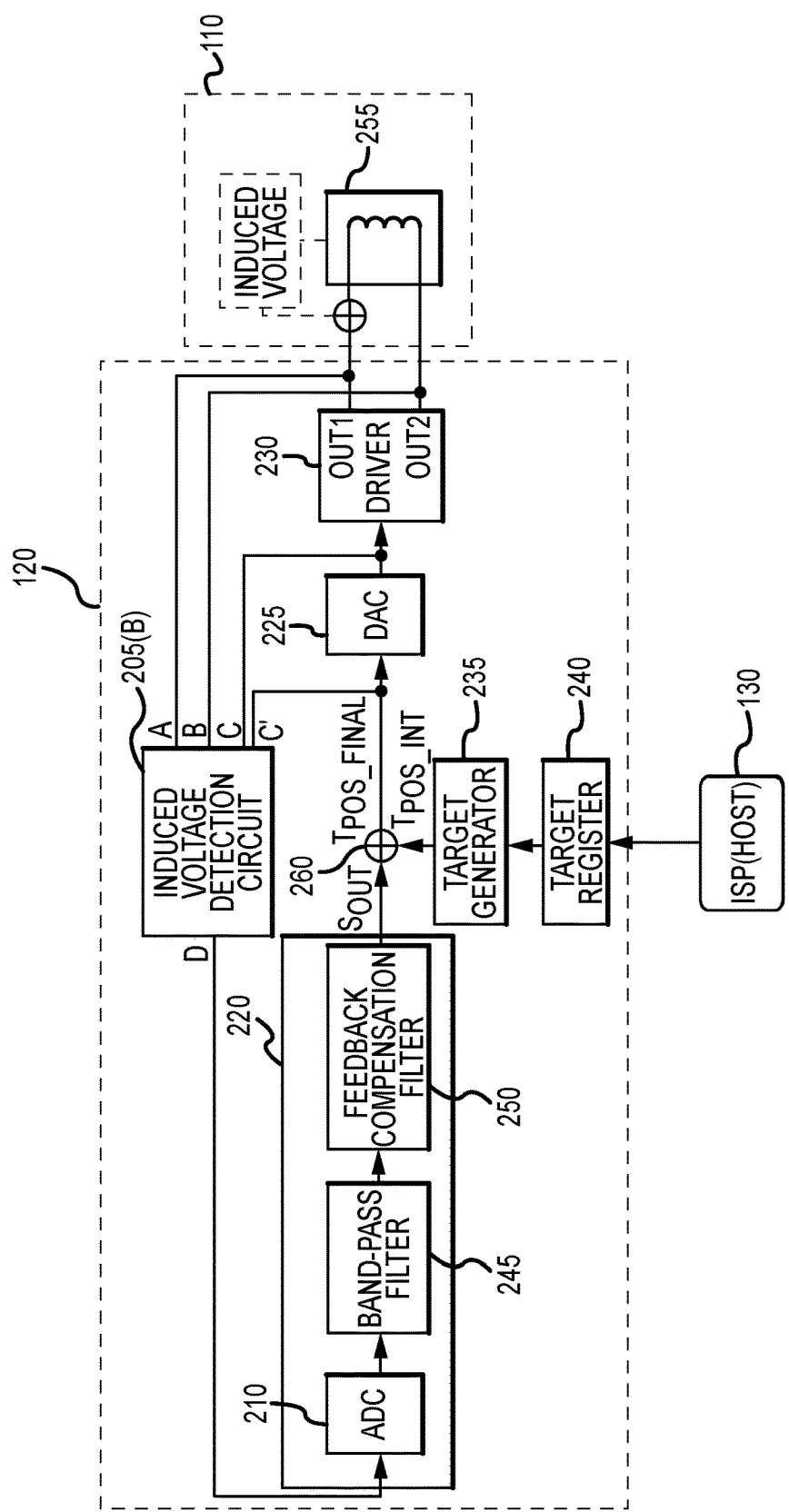
FIG. 3 is a block diagram of an autofocus system in accordance with a second embodiment of the present technology.
Figure 4:
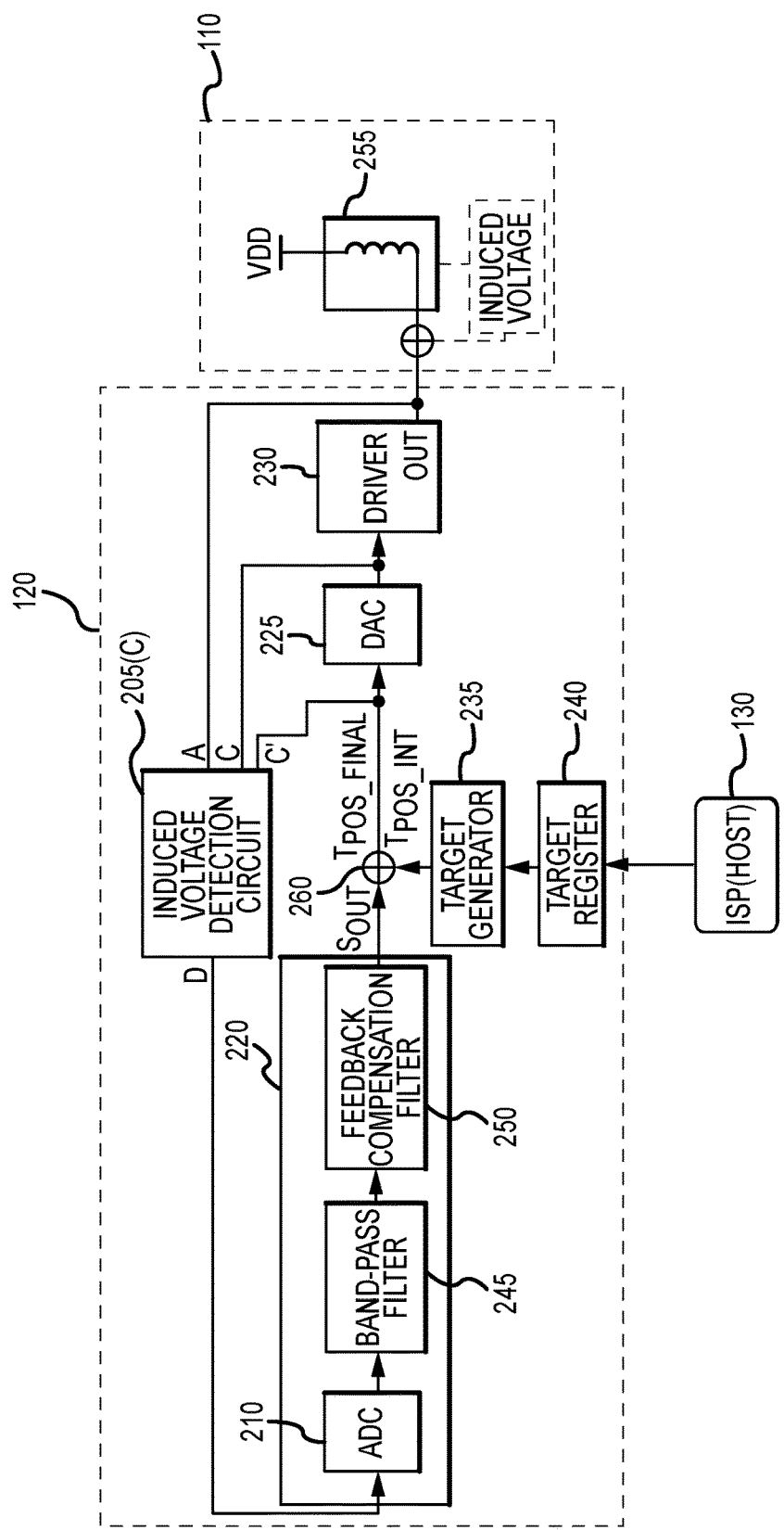
FIG. 4 is a block diagram of an autofocus system in accordance with a third embodiment of the present technology.

Referring to FIGS. 1-3, the control circuit 120 may comprise various feedback circuits and/or systems to decrease the length of time it takes the actuator 110 (and the lens 135) to reach a desired position. In general, once the control circuit 120 determines a target position and applies the drive current to the actuator 110, the actuator 110 (and the lens 135) oscillates for a period of time before it settles into the desired position. This period of time may be referred to as the settling time. The control circuit 120 may utilize feedback control systems and/or signals to decrease the settling time. For example, the control circuit 120 may comprise a feedback control circuit 220 and an induced voltage detection circuit 205. The feedback control circuit 220 may comprise at least one signal converter, for example an analog-to-digital converter (ADC) 210 and a digital filter.

The ADC 210 receives an analog signal and converts the analog signal to a digital signal. The ADC 210 may comprise any suitable system, device, or ADC architecture. According to various embodiments, the ADC 210 may receive an input signal D from the induced voltage detection circuit 205 and transmit an ADC output signal to the digital filter.

The digital filter may be configured to remove certain frequencies of a signal and allow other desired frequencies to pass through. The digital filter may be coupled between an output terminal of the ADC 210 and an input of an adder circuit 260. In various embodiments, the digital filter may comprise a band-pass filter 245, which removes predetermined high and low frequencies and allows intermediate frequencies (those frequencies between the high and low frequencies) to pass through. For example, the band-pass filter 245 may be set so that a resonance frequency is a center frequency and passes only the resonance component (i.e., those signals with the resonance frequency). The digital filter may further comprise a feedback compensation filter 250, such as a low-pass filter or a high-pass filter.

The digital filter may comprise any suitable circuit and/or system to perform various signal filtering, such as a band-pass filter, a low-pass filter, a high-pass filter, feedback compensation filters, and the like. The particular filter may be selected according to a particular application and/or desired filtering capabilities.

The control circuit 120 may further comprise various circuits and/or systems to generate a final target position $T_{POS\_FINAL}$ (also referred to as signal C') corresponding to a desired actuator position. The signal C' may comprise a code that corresponds to the magnitude of the desired drive current. For example, the control circuit 120 may comprise a target generator 235 to generate an initial position signal $T_{POS\_INT}$ (i.e., current code) and a target register 240 configured to store relevant data, such as position information, and communicate with the target generator 235 and/or the ISP 130.

The target register 240 may store position information transmitted from the ISP 130. The target register 240 may comprise any suitable memory or storage device capable of storing multiple variables at any given time. The target generator 235 may be configured to access data stored in the target register 240 to perform comparisons and/or generate the initial position signal $T_{POS\_INT}$. For example, the target generator 235 may comprise the signal generator described in U.S. Pat. No. 9,520,823.

In various embodiments, the control circuit 120 utilizes the initial position signal $T_{POS\_INT}$ from the target generator 235 and a filter output $S_{OUT}$ from the feedback control circuit 220 to generate the final target position $T_{POS\_FINAL}$. For example, the control circuit 120 may utilize the adder circuit 260 to add the initial position signal $T_{POS\_INT}$ to the filter output $S_{OUT}$ to compute the final target position $T_{POS\_FINAL}$.

The control circuit 120 may further comprise various circuits and/or systems adapted to receive the final target position $T_{POS\_FINAL}$ and respond by generating the drive current that will move the actuator 110 (and lens 135) to the desired position. For example, the control circuit 120 may comprise a driver 230 and a signal converter, such as a digital-to-analog converter (DAC) 225.

In DAC 225 may convert a digital value to an analog value (e.g., a voltage or a current) and output a DAC output signal C according to an input signal, such as the final target position $T_{POS\_FINAL}$. For example, the DAC 225 may be connected to an output terminal of the adder circuit 260 and receive the final target position signal $T_{POS\_FINAL}$ (C'). The DAC output signal C may be a positive value or a negative value. The sign of the DAC output signal C and the particular numerical value corresponds to the direction and magnitude, respectively, of the drive current supplied to the actuator 110.

The DAC 225 may communicate the DAC output signal C to the driver 230, wherein the driver 230 responds to the DAC output signal C by, for example, operating according to the sign and/or magnitude of the DAC output signal C. For example, a positive value may cause the drive current to flow from a first output terminal OUT1 to a second output terminal OUT2. Conversely, a negative value may cause the drive current to flow from the second output terminal OUT2 to the first output terminal OUT1. The DAC 225 may further communicate the sign (positive or negative) of the DAC output signal C to the induced voltage detection circuit 205. In various embodiments, the DAC output signal C corresponds to the magnitude of the desired drive current and to the signal C'.

The driver 230 (i.e., driver circuit) facilitates movement of the lens 135 to a desired position. The driver 230 may comprise any suitable circuit for varying a voltage across the circuit in order to generate the drive current output in response to an input signal. For example, the driver 230 may receive and respond to the DAC output signal C by generating a drive signal (i.e., the drive current). For example, the driver 230 may apply the drive signal to the actuator 110, wherein the drive signal may correspond to the final target position $T_{POS\_FINAL}$. The driver 230 may facilitate movement of the lens 135 to achieve the final target position $T_{POS\_FINAL}$ by controlling the drive current to the actuator 110, which in turn controls the magnitude and direction of movement of the lens 135.

Figure 9:
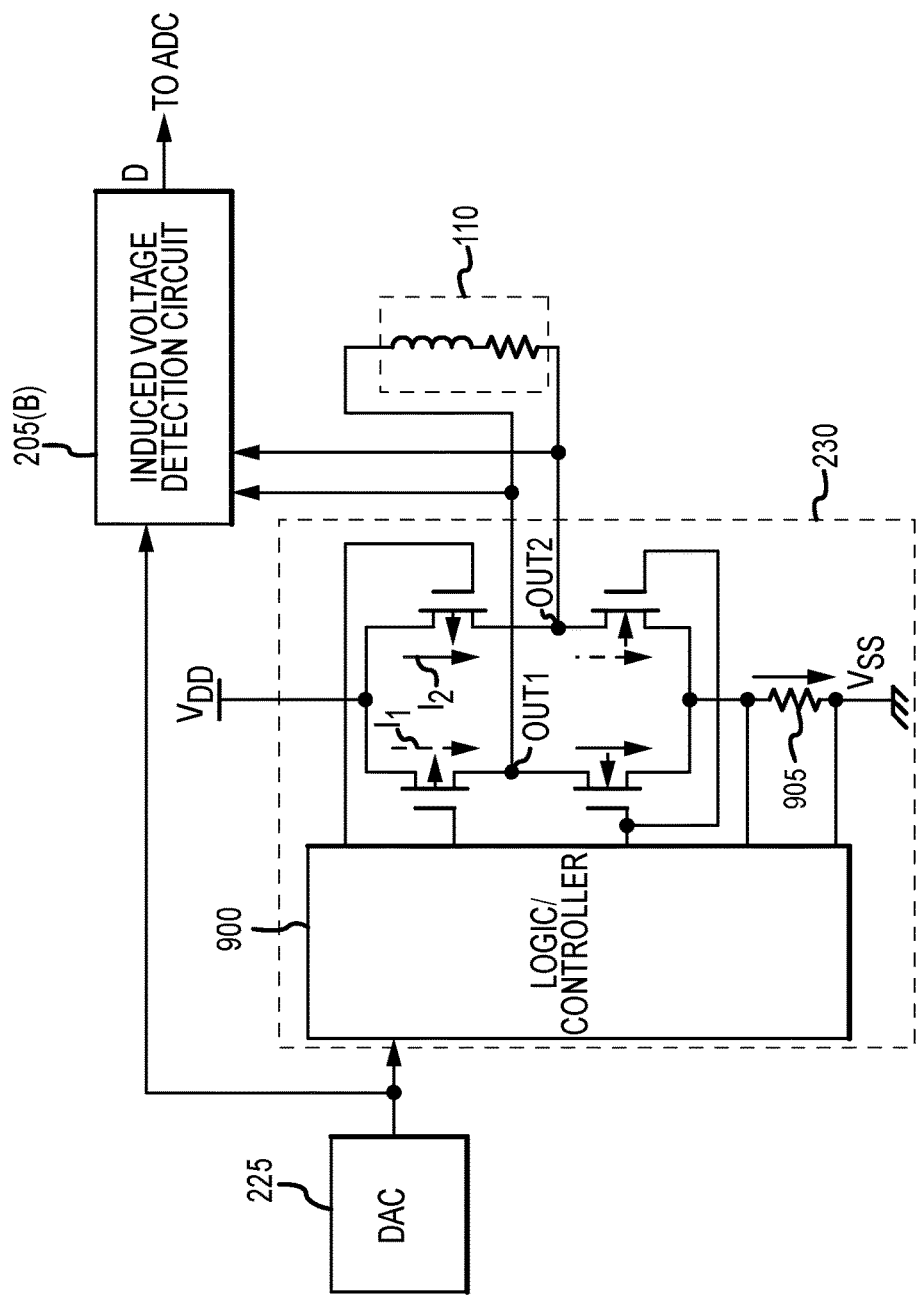
FIG. 9 is a circuit diagram of a portion of a bidirectional autofocus system in accordance with the second embodiment of the present technology.

In one embodiment, and referring to FIG. 9, the driver 230 may be coupled to the actuator 110 in such a way as to operate the actuator 110 in either a first direction or an opposite second direction. For example, the driver 230 may generate drive current through both the first and second output terminals OUT1, OUT2, wherein a first drive current $I_1$ may flow from the first output terminal OUT1 to the second output terminal OUT2 (i.e., the forward direction), or a second drive current $I_2$ from the second output terminal OUT2 to the first output terminal OUT1 (i.e., the reverse direction). The direction of the drive current based on the final target position $T_{POS\_FINAL}$.

Figure 10:
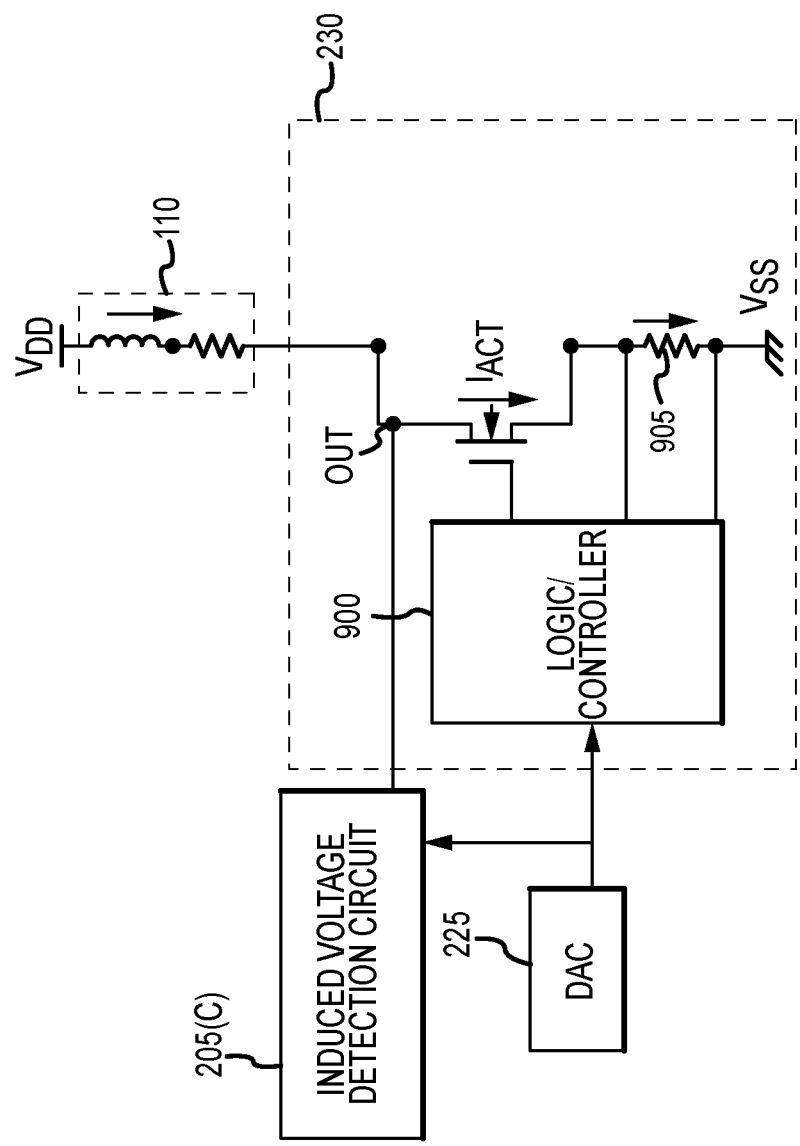
FIG. 10 is a block diagram of a unidirectional autofocus system in accordance with the third embodiment of the present technology.
Figure 11:
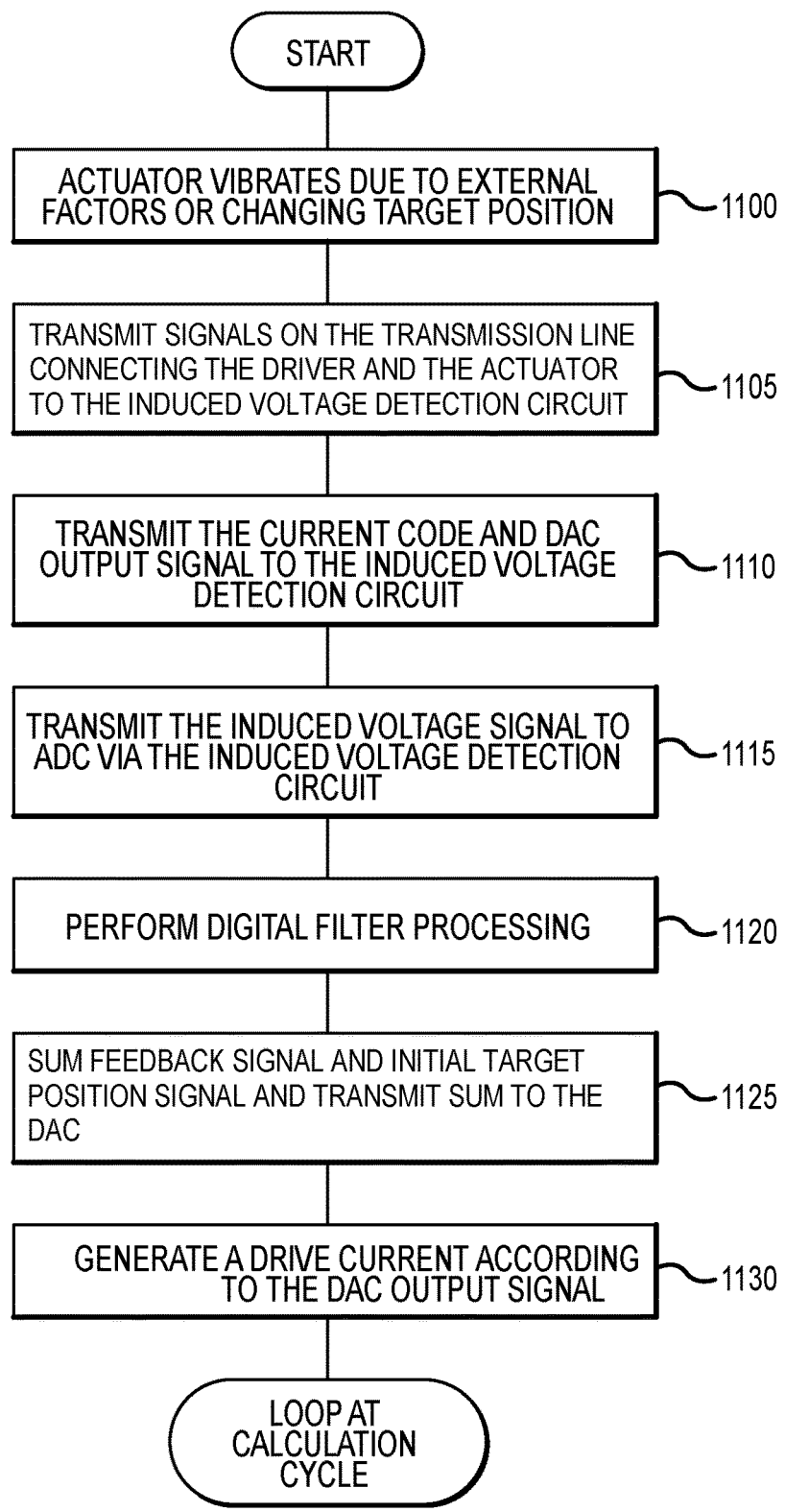
FIG. 11 is a flowchart for operating an autofocus system in accordance with various embodiments of the present technology.

In an alternative embodiment, and referring to FIG. 10, the driver 230 may be configured to generate a drive current that flows in one direction only. In the present embodiment, the driver 230 may comprise only one output terminal OUT.

Figure 18:
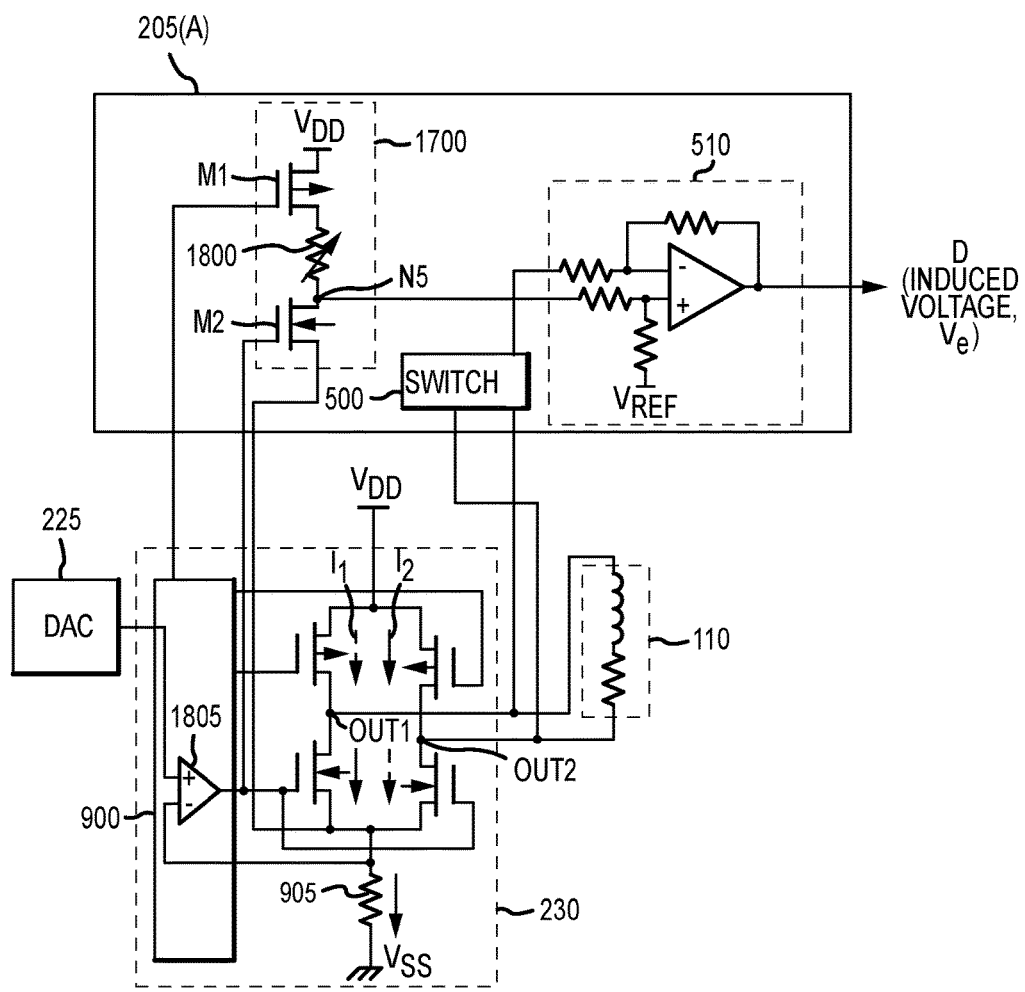
FIG. 18 is a circuit diagram of a portion of a bidirectional autofocus system in accordance with the first embodiment of the present technology.

In various embodiments, and referring to FIGS. 9 and 18, the driver 230 may comprise a controller 900 connected to an H-bridge drive circuit. The controller 900 may comprise various logic circuits or other circuits suitable for generating and transmitting various signals, current, voltage, and the like, to control the overall operation of the driver 230.

In one embodiment, and referring to FIG. 18, the controller 900 may be further connected to the induced voltage detection circuit 205(A) and configured to supply one or more signals to the induced voltage detection circuit 205(A). In the present embodiment, the controller 900 comprises an operational amplifier 1805 connected to the H-bridge driver.

According to various embodiments, the induced voltage detection circuit 205 may be configured to detect the induced voltage generated by the actuator 110. For example, and referring to FIG. 5, the induced voltage detection circuit 205(B) may be coupled to both the first and second output terminals OUT1, OUT2 in a bidirectional autofocus system. In other embodiments, and referring to FIG. 6, such as a unidirectional autofocus system, the induced voltage detection circuit 205(C) may be coupled to a single output terminal OUT. The induced voltage detection circuit 205 may further be communicatively coupled to the DAC output signal C and/or an adder output C'. The adder output C' may comprise a digital code and represent the final target position for the lens 135. In various embodiments, the induced voltage detection circuit 205(B/C) may comprise an output voltage replica circuit 505 and a differential amplifier 510.

Switch 500

Figure 5:
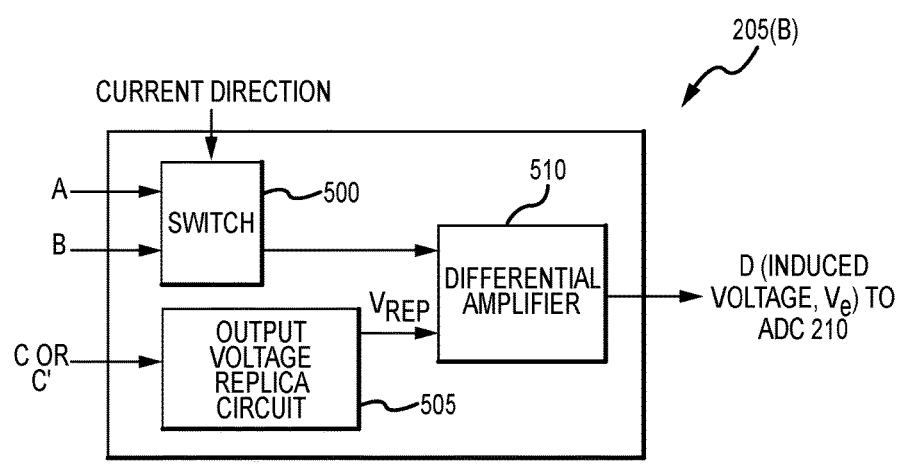
FIG. 5 is a block diagram of an induced voltage detection circuit in accordance with the second embodiment of the present technology.
Figure 6:
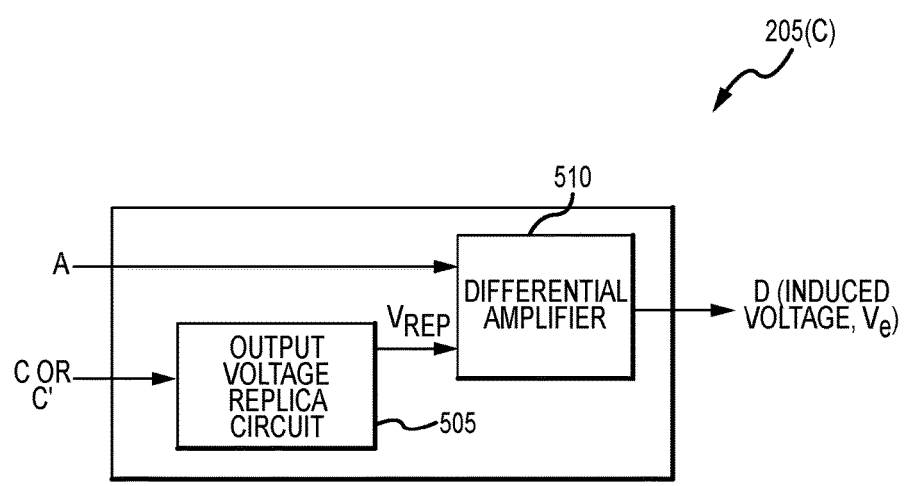
FIG. 6 is a block diagram of an induced voltage detection circuit in accordance with the third embodiment of the present technology.
Figure 7:
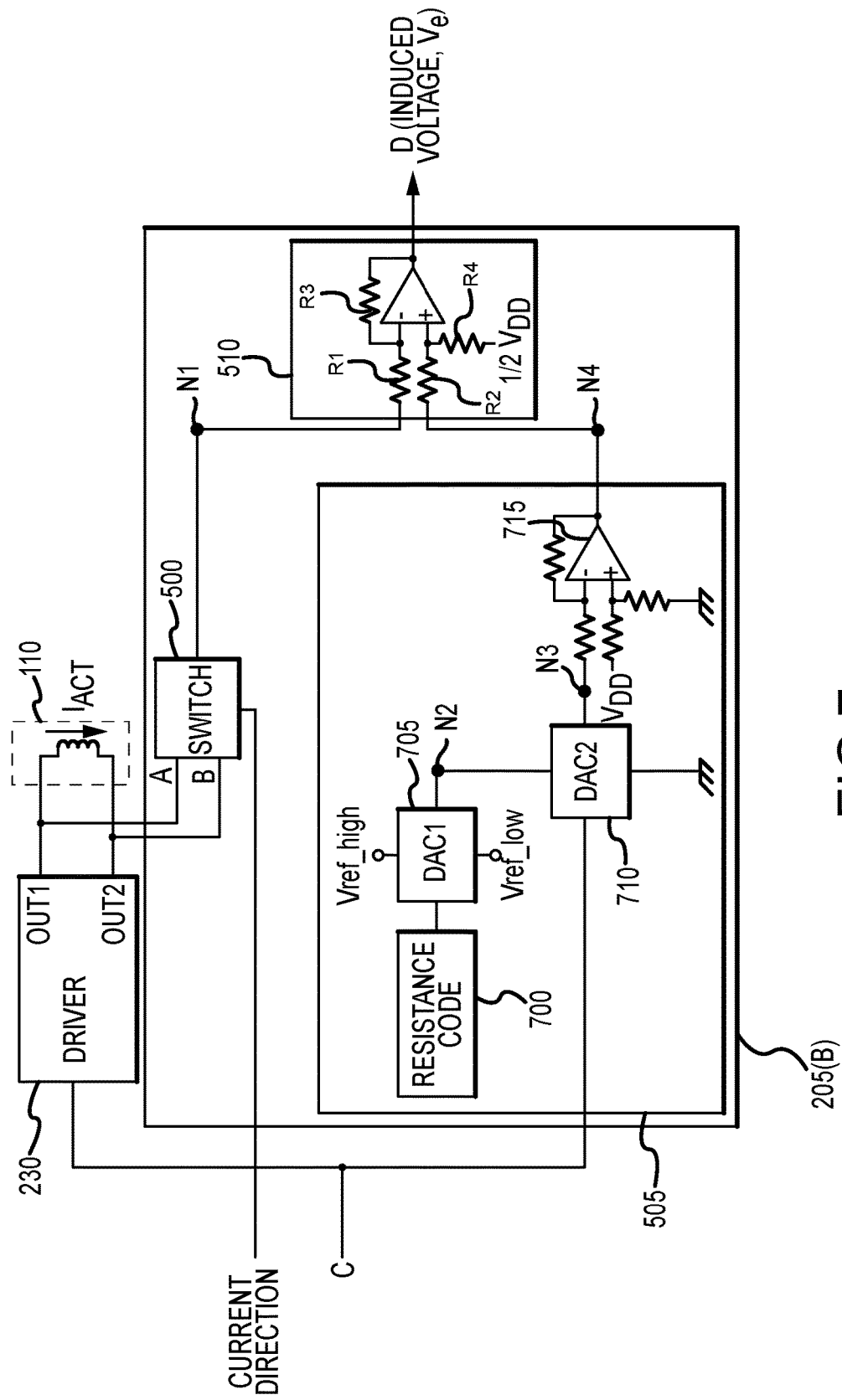
FIG. 7 is a circuit diagram of a portion of the autofocus system in accordance with the second embodiment of the present technology.
Figure 8:
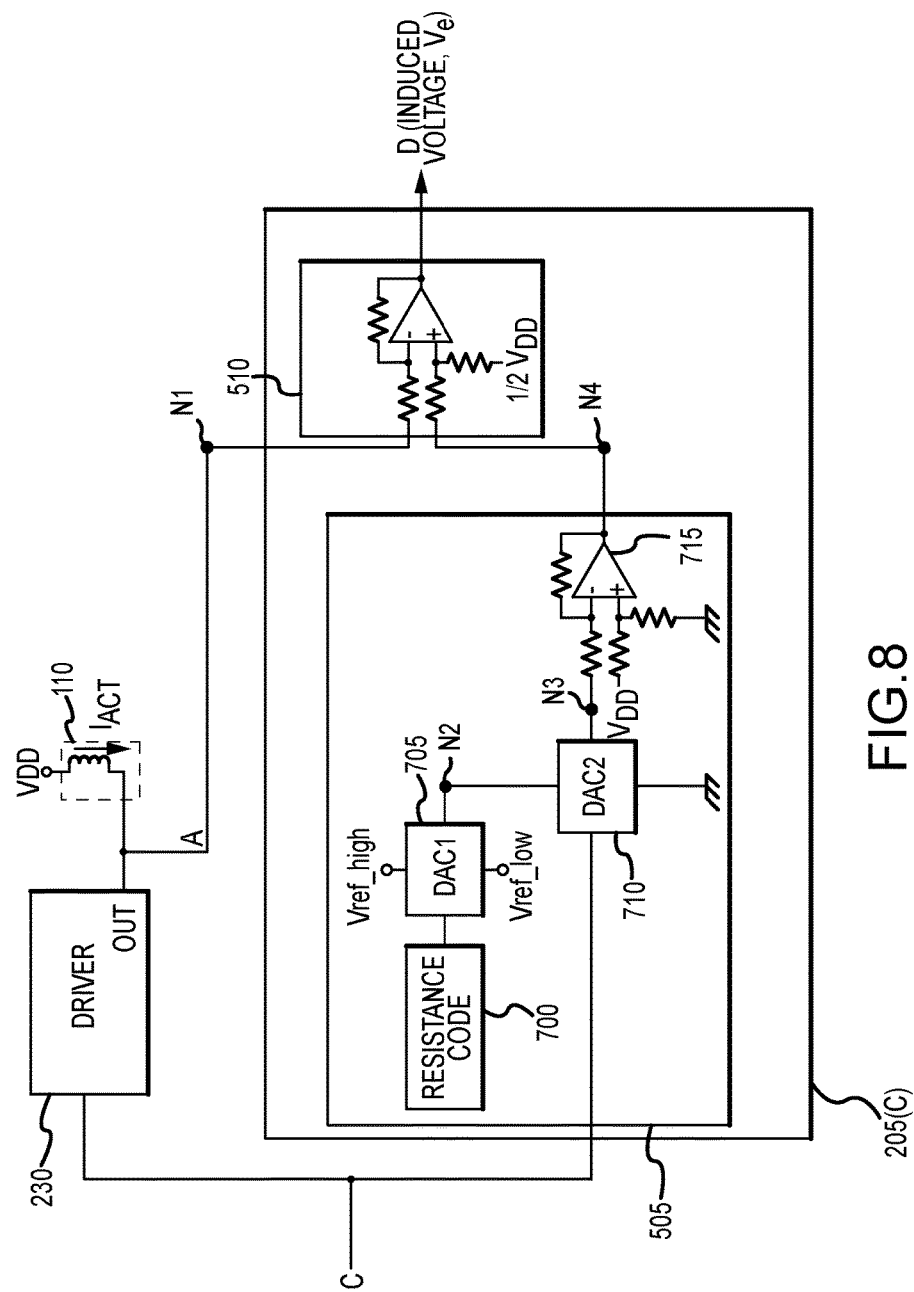
FIG. 8 is a circuit diagram of a portion of the autofocus system in accordance with the third embodiment of the present technology.
Figure 17:
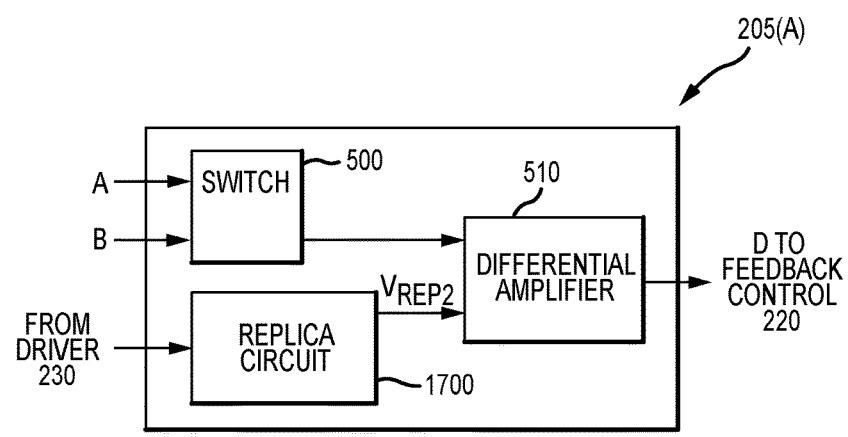
FIG. 17 is a block diagram of an induced voltage detection circuit in accordance with the first embodiment of the present technology.

In various embodiments, and referring to FIGS. 5 and 17, the induced voltage detection circuit 205 may further comprise a switch 500. The switch 500 may be configured to selectively connect one of two inputs to the differential amplifier 510 according to a control signal that represents the direction of the drive current through the actuator 110. For example, the switch 500 may be connected to the first and second output terminals OUT1, OUT2. The signal at the first output terminal OUT1 may be referred to as a first signal A and the signal at the second output terminal OUT2 may be referred to as a second signal B. The switch 500 may be configured to selectively couple one of the first signal A or the second signal B to the differential amplifier 510 according to the direction of the drive current through the actuator 110. For example, if the switch 500 receives a control signal with a positive sign (+), then the switch 500 may couple the second output terminal OUT2 (signal B) to the differential amplifier 510, and if the switch 500 receives a control signal with a negative sign (−), then the switch 500 may couple the first output terminal OUT1 (signal A) to the differential amplifier 510. The switch 500 may comprise any suitable circuit and/or system to select one of various inputs according to the control signal, such as a conventional analog switch, transistor, gated latch circuit, and the like.

Referring to FIGS. 5-8, the output voltage replica circuit 505 is configured to receive a signal, such as the DAC output signal C or the adder output C', and utilize the signal to generate a replicated voltage $V_{REP}$ of the driver 230. The output voltage replica circuit 505 is further configured to transmit the replicated voltage $V_{REP}$ to the differential amplifier 510. The output voltage replica circuit 505 may comprise any suitable circuit and/or system capable of replicating a voltage. For example, and referring to FIGS. 7 and 8, the output voltage replica circuit 505 may comprise a first digital-to-analog converter DAC 705 (DAC1), a second DAC 710 (DAC2), and amplifier 715.

The first DAC 705 may be configured to receive a resistance code RC. For example, the output voltage replica circuit 505 may receive the resistance code RC from a controller (not shown). The first DAC 705 may operate according to a high reference voltage Vref_high and a low reference voltage Vref_low. In an exemplary embodiment, the first DAC 705 may generate an output $DAC1_{OUT}$ at a second node N2 according to the following equation: $DAC1_{OUT}=(Vref\_high-Vref\_low)\times RC+Vref\_low$.

The second DAC 710 may be configured to receive the output signal C and the output $DAC1_{OUT}$ as input signals. In an exemplary embodiment, the second DAC 710 may generate an output $DAC2_{OUT}$ at a third node N3 according to the following equation: $DAC2_{OUT}=(DAC1_{OUT}-GND)\times C+GND=DAC1_{OUT}\times C$.

The amplifier 715 may comprise an inverting amplifier and configured to receive the output $DAC2_{OUT}$ from the second DAC 710 at an inverting terminal (−) and reference voltage at a non-inverting terminal (+). The amplifier 715 may be configured to generate an output $AMP_{OUT}$ at a fourth node N4 (also referred to as a fourth node voltage $V_{N4}$) according to the following equation: $AMP_{OUT}=V_{DD}-[(Vref\_high-Vref\_low)\times RC+Vref\_low]\times C$, where $(Vref\_high-Vref\_low)\times RC+Vref\_low=R_{ACT}\times Cmax$, where $R_{ACT}$ is the resistance of the actuator 110 and Cmax is the maximum drive current through the actuator 110. When RC=0, then $R_{ACT}\times Cmax=Vref\_low$, and when RC=1, then $R_{ACT}\times Cmax=Vref\_high$.

The differential amplifier circuit 510 may be configured to receive a first signal from a first node N1 and a second signal from the fourth node N4. For example, the differential amplifier 510 may comprise an amplifier and various resistors having resistance values, such as resistance values R1, R2, R3, and R4. According to various embodiments, the signal at the first node N1 ($V_{N1}$) may be described according to the following equation: $V_{N1}=V_{DD}-(R_{ACT}\times Cmax\times C)$. Further, the signal at the fourth node N4 ($V_{N4}$) may be described as follows: $V_{N4}=AMP_{OUT}=V_{DD}-[(Vref\_high-Vref\_low)\times RC+Vref\_low]\times C$.

In general, the differential amplifier circuit 510 may generate an output that represents the induced voltage Ve, where the induced voltage is the difference between the signal at the first node N1 and the signal at the fourth node N4 (i.e., $Ve=V_{N1}-V_{N4}$. More specifically, in an exemplary embodiment, R1=R2 and R3=R4, therefore, the induced voltage Ve may be described by the following equation: $Ve=R3/R1\times(V_{N4}-V_{N1})+V_{DD}/2$.

In an alternative embodiment, and referring to FIGS. 2, 17, and 18, the induced voltage detection circuit 205(A) may be configured to detect the induced voltage Ve by cancelling the DC voltage component of the signal at the first output terminal OUT1. In the present embodiment, the induced voltage detection circuit 205(A) may comprise a replica circuit 1700 and the differential amplifier 510. The replica circuit 1700 may be connected to the logic circuit 900, the driver 230, and the differential amplifier circuit 510.

According to the present embodiment, the replica circuit 1700 may comprise transistors M1, M2 configured to generate a current that is proportional to and less than that of the drive current through the driver 230. The replica circuit 1700 may further comprise a variable resistor 1800 that can be adjusted to match the resistance of the actuator 110.

The differential amplifier circuit 510 may be connected to the replica circuit 1700 at a fifth node N5 located between the variable resistor 1800 and the transistor M2 such that the voltage at the fifth node N5 is detected by the differential amplifier 510 and compared to the voltage at the first output terminal OUT1 of the driver 230. The voltage at the fifth node N5 and the voltage at the first output terminal OUT1 are substantially the same and the induced voltage component is small compared to the DC component. Therefore, the output of the differential amplifier circuit 510 represents the amplified induced voltage without the DC component. As in previous embodiments, the induced voltage detection circuit 205(A) may transmit the induced voltage Ve to the feedback control circuit 220 and used to control the driver 230.

According to various embodiments, the methods and apparatus for actuator control operate to reduce the settling time of the actuator 110 by utilizing the voltage induced by the actuator 110 (i.e., back EMF, induced voltage). The methods and apparatus operate to measure the induced voltage and provide a feedback signal, corresponding to the induced voltage, to reduce the speed of the actuator 110 and thereby suppress resonance vibrations. The methods and apparatus may further implement various digital signal processing functions to filter various frequencies and detect a magnitude of the induced voltage. The methods and apparatus may further operate to measure and/or detect the induced voltage as the drive current through the actuator 110 dynamically changes. According to various embodiments, the methods and apparatus for actuator control operate to continuously provide feedback control to the actuator and detect the induced voltage without turning the system OFF. In other words, the actuator 110 remains ON during detection of the induced voltage and the feedback control operation.

Figure 16A:
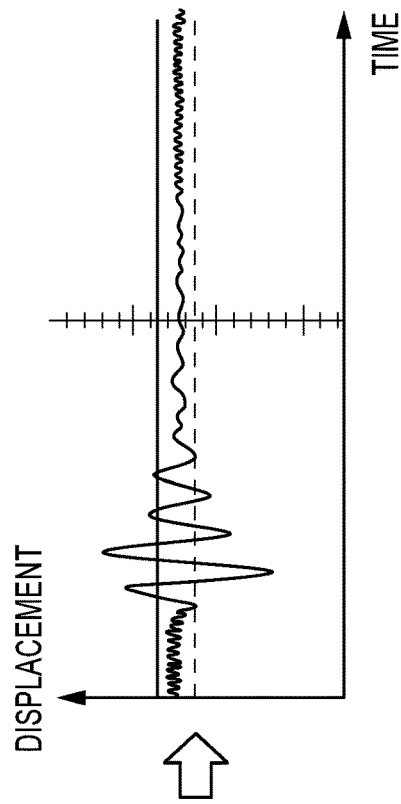
FIG. 16A is a waveform representing the displacement of the lens (relative to a target position) in an autofocus system without feedback control, where the displacement is a result of external forces.
Figure 16B:
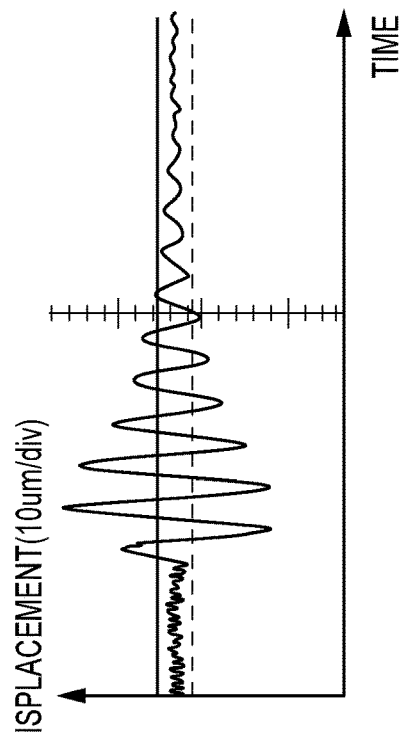
FIG. 16B is a waveform representing the displacement of the lens (relative to a target position) in accordance with an exemplary embodiment of the present technology, where the displacement is a result of external forces.

Further the induced voltage is utilized to perform feedback control and adjust the drive signal according to the direction and magnitude of the induced voltage. Further, the control circuit 120 may provide continuous feed-back control of the drive signal, rather than a sequential feedback control. As such, the method and apparatus may produce a lens displacement output waveform that converges at the target position in less time (FIGS. 15B and 16B) than an existing method and apparatus (FIGS. 15A and 16A).

Referring to FIGS. 1, 3, 5, 7, and 11, during operation of the electronic device, the actuator 110 may experience vibrations due to a user inadvertently applying external vibrations to the electronic device or vibrations due to changing the target position, both of which generates the induced voltage (1100).

The control circuit 120 may transmit the output signals from the driver 230 terminals OUT1, OUT2 (i.e., signals A and B) to the induced voltage detection circuit 205 via transmission lines connected between the driver 230 and the actuator 110 (1105). The control circuit 120 may also transmit the drive current direction and the DAC output signal C to the induced voltage detection circuit 205 (1110).

The induced voltage detection circuit 205 may then transmit the induced voltage signal D to the ADC 210 (1115). The control circuit 120 may then perform filtering, for example with the digital filter (1120). The control circuit 120 may then add the signal output from the feedback control circuit 220 ($S_{OUT}$) with the initial target position $T_{POS\_INT}$ and transmit the sum to the DAC 225 (1125), where the DAC 225 then converts the adder output C' to an analog signal that is then fed into the driver 230 to generate the drive signal (i.e., the drive current). The drive signal then controls the movement of the actuator 110 according to the sign and magnitude of the drive signal (1130).

According to various embodiments, the control circuit 120 may continuously detect and feedback the induced voltage while the drive current changes and suppress resonance vibrations caused by external forces or control operations. For example, and referring to FIGS. 7 and 12-14 at a first time T1, a vibration occurs; at a second time T2, the position information from the ISP 130 (FIG. 1) is updated and the drive current beings to change (e.g., from $I_1$ to $I_2$); at a third time T3, the drive current change ends; and at a fourth time T4, the vibration occurs.

Figure 12:
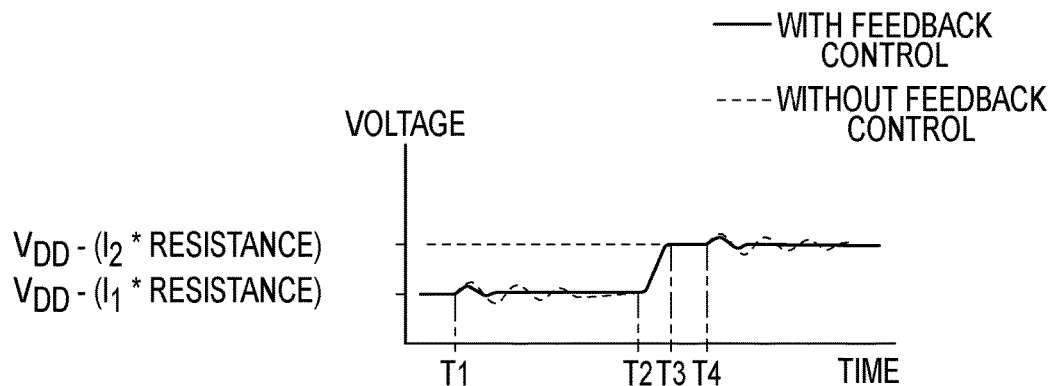
FIG. 12 is an intermediate voltage waveform generated by the induced voltage detection circuit in accordance with an embodiment of the present technology.
Figure 13:
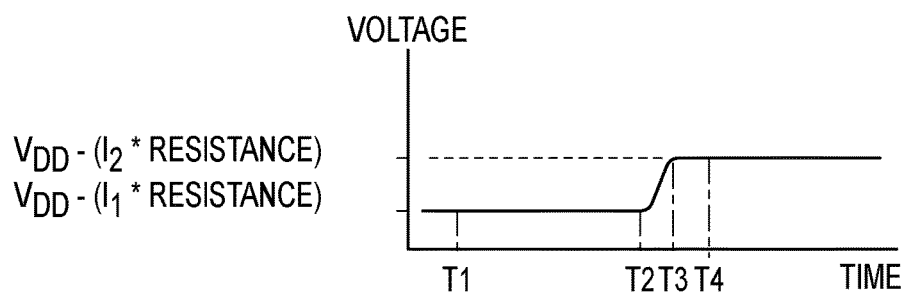
FIG. 13 is an intermediate voltage waveform generated by the induced voltage detection circuit in accordance with an embodiment of the present technology.
Figure 14:
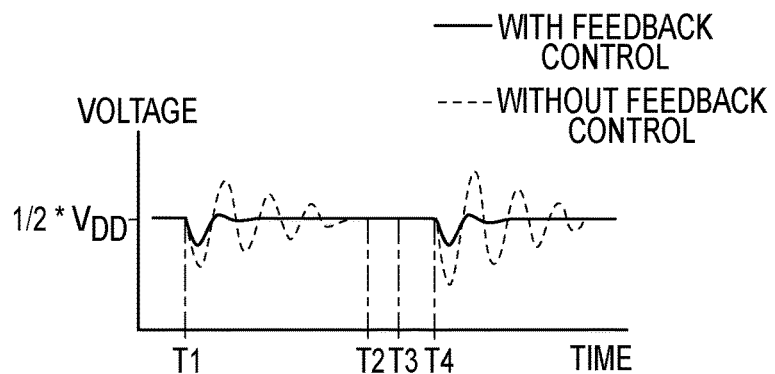
FIG. 14 is an output voltage waveform generated by the induced voltage detection circuit in accordance with an embodiment of the present technology.

Referring to FIGS. 12-14, without feedback control, when the signal at the first node N1 (FIG. 12) is combined with the signal at the fourth node N4 (FIG. 13), the signal generated by the differential amplifier circuit 510 (FIG. 14) is an amplified version of the induced voltage Ve. However, with feedback control, when the signal at the first node N1 is combined with the signal at the second node N2, the resonance vibrations are suppressed and the induced voltage Ve is reduced.

Referring to FIGS. 1, 2, 17, and 18, in an alternative operation, the actuator 110 may experience vibrations due to a user inadvertently applying external vibrations to the electronic device or vibrations due to changing the target position. As the drive current through the actuator 110 changes, the current through the replica circuit 1700 also changes proportionally. As a result the voltage at the fifth node N5 is substantially the same as the voltage at the first output terminal OUT1. The differential amplifier circuit 510 detects the voltage of the replica circuit 1700 and compares it to the driver voltage, such as the voltage at the first output terminal OUT1. The differential amplifier circuit 510 cancels the DC component of the input voltages (e.g., the voltage at the fifth node and the voltage at the first output terminal OUT1) and amplifies the remaining component, in this case, the induced voltage Ve.

Figure 19:
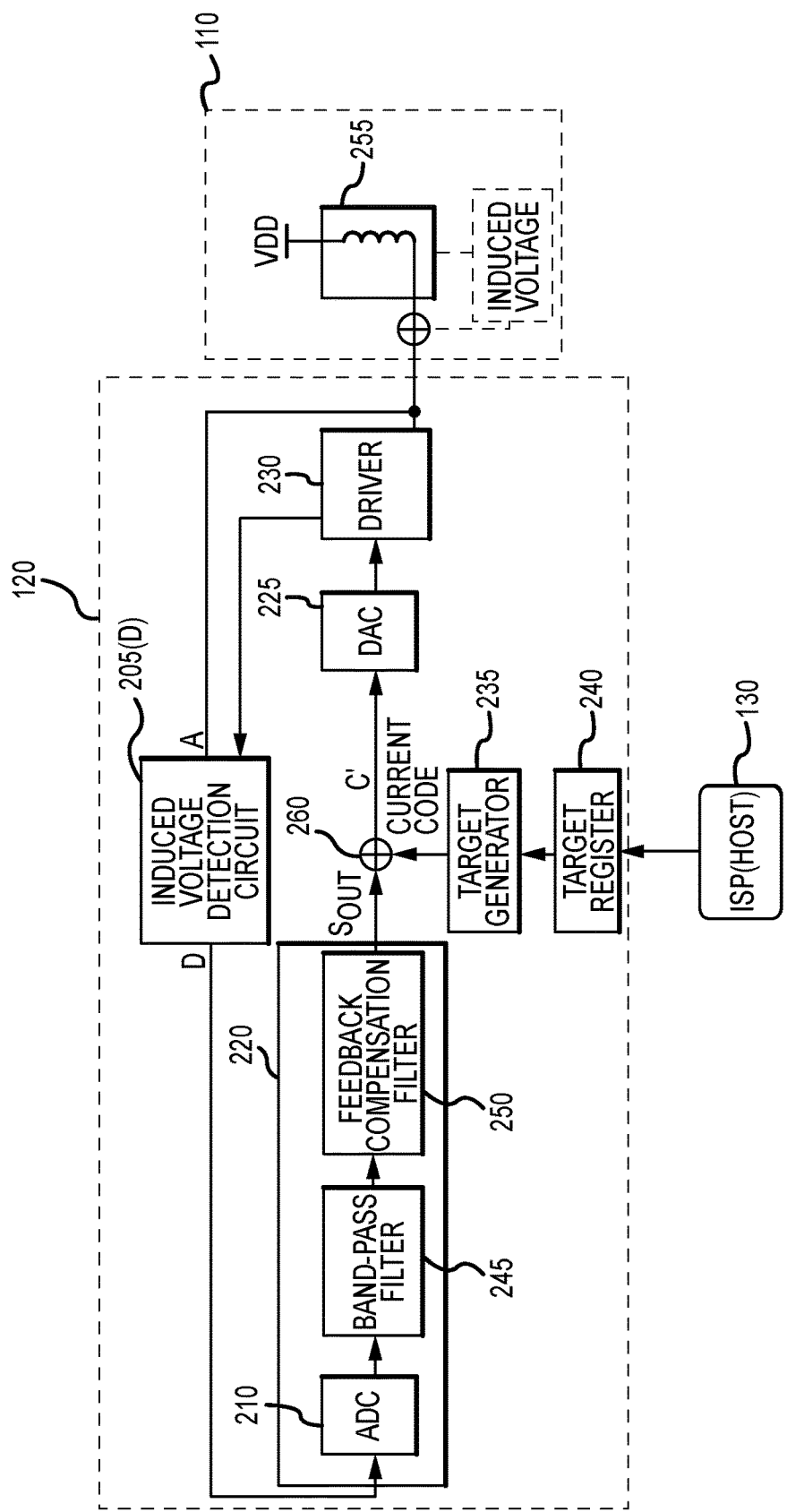
FIG. 19 is a block diagram of an autofocus system in accordance with a fourth embodiment of the present technology.
Figure 20:
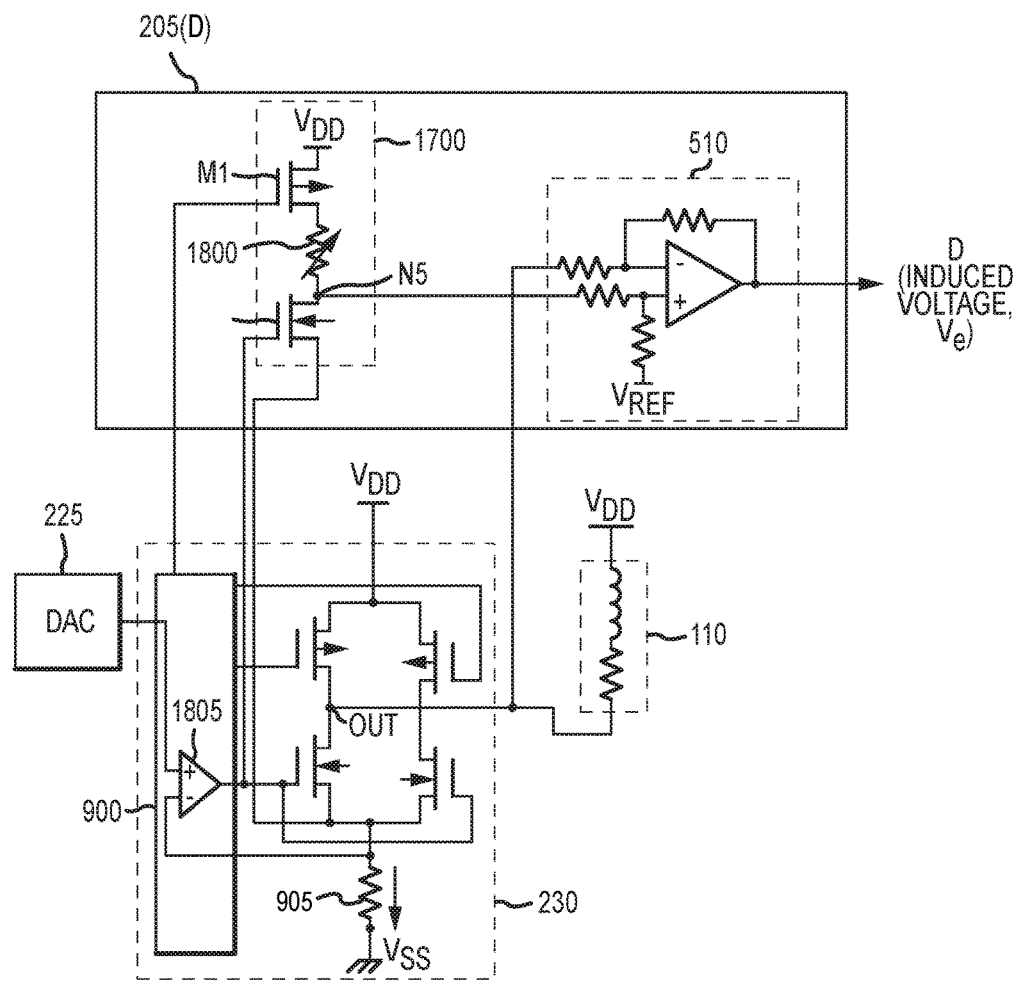
FIG. 20 is a circuit diagram of a portion of a unidirectional autofocus system in accordance with the fourth embodiment of the present technology.

The replica circuit 1700 may be further utilized in a unidirectional type actuator 110, for example as illustrated in FIGS. 19 and 20.

In the foregoing description, the technology has been described with reference to specific exemplary embodiments. Various modifications and changes may be made, however, without departing from the scope of the present technology as set forth. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any appropriate order and are not limited to the explicit order presented in the specific examples. Additionally, the components and/or elements recited in any system embodiment may be combined in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/ or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology.

The invention claimed is:

1. An actuator control circuit, comprising:
a driver circuit connected to the actuator and configured to supply a drive signal to the actuator; and
an induced voltage detection circuit connected to:
a first output terminal of the driver circuit; and
the actuator;
wherein the induced voltage detection circuit is configured to: generate a replica voltage, wherein the replica voltage is a replica of a DC component of an output voltage of the driver circuit; and
output an induced voltage of the actuator according to:
the output voltage of the driver circuit; and
the replica voltage.

2. The actuator control circuit according to claim 1, wherein the induced voltage detection circuit comprises:
an output voltage replica circuit configured to replicate the DC component of the output voltage of the driver circuit; and
a differential amplifier circuit connected to an output terminal of the output voltage replica circuit, wherein the differential amplifier circuit outputs the induced voltage.

3. The actuator control circuit according to claim 2, wherein the induced voltage detection circuit further comprises a switch connected to the first output terminal of the driver circuit and a second output terminal of the driver circuit, and configured to selectively connect the driver circuit to the differential amplifier circuit via one of the first output terminal and the second output terminal of the driver circuit.

4. The actuator control circuit according to claim 2, wherein the differential amplifier circuit is further directly connected to the first output terminal of the driver circuit.

5. The actuator control circuit according to claim 2, wherein the output voltage replica circuit comprises:
a first digital-to-analog converter (DAC) configured to receive:
a high reference voltage;
a low reference voltage; and
a resistance code; and
a second DAC connected to an output terminal of the first DAC and an input terminal of the differential amplifier circuit.

6. The actuator control circuit according to claim 1, further comprising a feedback control circuit connected to:
an output terminal of the induced voltage detection circuit; and
the driver circuit.

7. The actuator control circuit according to claim 1, wherein the induced voltage detection circuit comprises:
a replica circuit connected to the actuator and configured to generate the replica voltage; and
a differential amplifier circuit connected to the replica circuit.

8. The actuator control circuit according to claim 7, wherein the replica circuit comprises:
a first transistor connected to a supply voltage at a first terminal;
a second transistor connected to a second terminal of the first transistor;
a variable resistor connected between the first and second transistors.

9. The actuator control circuit according to claim 8, wherein a non-inverting terminal of the differential amplifier circuit is connected to the replica circuit at a node located between the variable resistor and the second transistor.

10. A method for detecting an induced voltage in an actuator operated by a driver circuit, comprising:
receiving, at a terminal of a differential amplifier circuit, an output voltage from the driver circuit;
generating a replica voltage, wherein the replica voltage is a replica of a DC component of an output voltage of the driver circuit; and
generating, with the differential amplifier circuit, a difference signal according to at least one of the replica voltage and the output voltage;
wherein the difference signal represents the induced voltage.

11. The method according to claim 10, wherein generating the difference signal comprises:
receiving the output voltage at an inverting terminal of the differential amplifier circuit; and
receiving the replica voltage at a non-inverting terminal of the differential amplifier circuit.

12. The method according to claim 10, wherein generating the replica voltage comprises: generating a current that is proportional to a driver current.

13. The method according to claim 10, wherein generating the replica voltage comprises:
generating a first signal according to:
a high reference voltage;
a low reference voltage; and
a resistance code; and
generating a second signal according to:
the first signal; and
a third signal representing position information.

14. An imaging system capable of detecting an induced voltage in an actuator, comprising:
an image sensor coupled to an image signal processor, wherein the image sensor transmits image data to the image signal processor; and
a control circuit coupled to the image signal processor and configured to receive a target position from the image signal processor, comprising:
a drive circuit connected to the actuator and comprising:
a first output terminal; and
a second output terminal; and
an induced voltage detection circuit connected to:
at least one of the first and second output terminals of the driver circuit; and
the actuator;
wherein the induced voltage detection circuit is configured to:
generate a replica voltage, wherein the replica voltage is a replica of a DC component of an output voltage of the driver circuit; and
output an induced voltage of the actuator according to:
an output voltage of the driver circuit; and
the replica voltage.

15. The imaging system according to claim 14, wherein the induced voltage detection circuit comprises: an output voltage replica circuit configured to replicate the DC component of the output voltage of the driver circuit; and
a differential amplifier circuit connected to an output terminal of the output voltage replica circuit, wherein the differential amplifier circuit outputs the induced voltage.

16. The imaging system according to claim 15, wherein the induced voltage detection circuit further comprises a switch connected to the first output terminal of the driver circuit and the second output terminal of the driver circuit, and configured to selectively connect the driver circuit to the differential amplifier circuit via one of the output terminals of the driver circuit.

17. The imaging system according to claim 15, wherein the output voltage replica circuit comprises:
   a first digital-to-analog converter (DAC) configured to receive:
      a high reference voltage;
      a low reference voltage; and
      a resistance code; and
   a second DAC connected to an output terminal of the first DAC and an input terminal of the differential amplifier circuit.

18. The imaging system according to claim 14, wherein the induced voltage detection circuit comprises:
   a replica circuit connected to the actuator and configured to generate the replica voltage; and
   a differential amplifier circuit connected to the replica circuit.

19. The imaging system according to claim 18, wherein the replica circuit comprises:
   a first transistor connected to a supply voltage at a first terminal of the first transistor;
   a second transistor connected to a second terminal of the first transistor;
   a variable resistor connected between the first and second transistors.

20. The imaging system according to claim 19, wherein a non-inverting terminal of the differential amplifier circuit is connected to the replica circuit at a node located between the variable resistor and the second transistor.

* * * * *